United States Patent [19]
Smith et al.

[11] Patent Number: 5,213,767
[45] Date of Patent: May 25, 1993

[54] DRY EXHAUST GAS CONDITIONING

[75] Inventors: James R. Smith; Peter L. Timms, both of Bristol, United Kingdom

[73] Assignee: BOC Limited, Surrey, England

[21] Appl. No.: 613,572

[22] PCT Filed: May 31, 1989

[86] PCT No.: PCT/GB89/00600
§ 371 Date: Dec. 3, 1990
§ 102(e) Date: Dec. 3, 1990

[87] PCT Pub. No.: WO89/11905
PCT Pub. Date: Dec. 14, 1989

[30] Foreign Application Priority Data
Jun. 4, 1988 [GB] United Kingdom ............ 8813270

[51] Int. Cl.$^5$ ............ B01D 53/00; B01D 53/34
[52] U.S. Cl. .................... 422/177; 422/171; 423/210; 423/240 S; 423/241
[58] Field of Search ........... 422/171, 177; 423/210, 423/240 S, 241

[56] References Cited
U.S. PATENT DOCUMENTS

| | | | |
|---|---|---|---|
| 4,036,940 | 7/1977 | McLane | 423/503 |
| 4,442,077 | 4/1984 | Foster et al. | 423/210 |
| 4,535,072 | 8/1985 | Kitayama et al. | 502/411 |
| 4,629,611 | 12/1986 | Fan | 423/240 S |
| 4,684,510 | 8/1987 | Harkins | 423/210 |

FOREIGN PATENT DOCUMENTS

| | | |
|---|---|---|
| 0184342 | 6/1986 | European Pat. Off. |
| 0194366 | 9/1986 | European Pat. Off. |
| 0303368 | 7/1988 | European Pat. Off. |
| 0294142 | 12/1988 | European Pat. Off. |
| 1101231 | 5/1986 | Japan ............ 423/240 S |
| 204025 | 9/1986 | Japan ............ 423/240 S |
| 2152519 | 7/1987 | Japan. |
| 0012322 | 1/1988 | Japan ............ 423/240 S |
| 0990273 | 1/1983 | U.S.S.R. ........ 423/240 S |

OTHER PUBLICATIONS

Selamoglu, N.; Mucha, J. A.; Flamm, D. L.; Ibbotson, D. E.; "Catalyzed Gaseous Etching of Silicon" Mater. Res. Soc. Symp. Proc., 75 (Photon, Beam, *Plasma Stimul. Chem. Processes Surf.*), 459-465 (1987).

Primary Examiner—Robert J. Warden
Assistant Examiner—Stephanie Blythe
Attorney, Agent, or Firm—David M. Roseblum; Larry R. Cassett

[57] ABSTRACT

This invention relates to gas treatment apparatus and methods and particularly, but not exclusively, to such apparatus and methods for use with exhaust products from semi-conductor manufacturing process.

A reactor column 10 has an inlet 11 at the bottom and an outlet 12. Between the inlet and outlet it is divided into three sequential stages containing: silicon or silicon containing materials; lime or soda lime and copper oxide or copper oxide reagents.

19 Claims, 3 Drawing Sheets

DRY EXHAUST GAS CONDITIONING

The purpose of the invention is to convert certain hazardous gaseous effluents by chemical reactions into safer solid or gaseous products. Preferably the chemical reagents used are solids and hence reduce the risk of carry-over contamination from the gas conditioning equipment. The solid chemical reagents used are easier and safer to handle than liquid reagents. The solid reagents lend themselves readily to encapsulation in exchangeable cartridges.

The gaseous effluents can be the gases that come from etching of semi-conductor devices or from PECVD (Plasma Enhanced Chemical Vapour Deposition) on to semi-conductor materials: similar gases and vapours are used in several stages of manufacture in the semi-conductor manufacturing process. The effluent gases (and vapours) from reactive ion etching and plasma etching include Chlorine, Silicon tetrachloride, Copper chloride (CuCl), Aluminium Chlorides (i.e. $AlCl_3$), Silicon tetraflouride, trifluoromethane ($CHF_3$), Carbonyl fluoride ($COF_2$), Carbonyl chloride ($COCl_2$), Boron trichloride ($BCl_3$), Boron tribromide ($BBr_3$), Hydrogen chloride (HCl), Carbon tetra-chloride ($CCl_4$), chlorofluoro carbon gases and others.

Additional gases and vapours that are sometimes found in the effluent of PECVD operations include Silane ($SiH_4$), dichlorosilane ($SiCl_2H_2$), tetraethlorthosilicate ($Si(OC_2H_5)_4$), Diborane ($B_2H_6$), Trimethyl borate ($B(OCH_3)_3$), Phosphine ($PH_3$), Trimethylphosphite ($P(OCH_3)_3$), Arsine ($AsH_3$) and others.

The current practice is to allow these gases/vapours to enter an exhaust duct to be transported to a wet scrubber positioned at the exhaust end of the lines. This method is occasionally supplemented by local placement of scrubbers. For etching these may be either:

(a) Of the activated charcoal type to trap the acid gases. This method can trap up to 15% of its charcoal weight of $Cl_2$. The product is charcoal with the effluent gases trapped but not converted to safer products and some of these effluent gases will be liberated if the charcoal is burnt.

(b) Of the wet type; there are several designs of wet scrubber, most using either a Venturi stage or a packed tower or a combination of both. These designs have been used for larger applications: when placed local to the source of the contamination they present the danger of contamination of the process chamber with their aqueous solutions of caustic type media. The contamination can result from a back streaming type of mechanism or from a massive suckback (c) The chemical filter type utilizing a combination of adsorption and chemical adsorption. These are expensive and do not have a good capacity per unit volume.

PECVD scrubbers can be as above but often have a Burn box gas conditioning unit introduced locally. These units burn the effluent gases to form their oxides and water vapour. They suffer from blockage problems and there are normally large volumes of oxides to contend with.

The chemical exhaust gas conditioning unit of this invention operates in two main sections and an optional third section. The effluent gases pass first through a section in which the active chemical component is elemental silicon Second, through a section in which the active component is lime, or soda lime (calcium oxide or calcium hydroxide). Third, and optionally, through a section in which the active components are lime and copper oxides (CuO or $Cu_2O$). These sections can be housed in a single container (FIG. 1) or compartmentalised in different containers (FIG. 2) so that the gases can flow from one to the next. Alternatively the sections can be combined, the silicon mixed with the lime/soda lime in a single reactor.

Broadly stated from one aspect the invention consists in apparatus for treatment of exhaust gases, comprising means for exposing the gases to silicon, or a silicon rich alloy or substance, and means for then exposing the gases to calcium oxide or a calcium oxide compound or calcium oxide containing material, or a soda lime containing medium.

In a preferred embodiment the apparatus comprises a first (silicon) stage, and a second (calcium oxide) stage arranged in sequence and conveniently a single gas treatment chamber may have in series silicon and calcium oxide containing zones.

In the first stage, the silicon should have a purity greater than 90% but preferably greater than 97%. It can be mixed with "inert" substances such as silica or alumina or even with lime (CaO) or magnesia (MgO). It can also, though with increased problems, be alloyed with any of the metals Cr, Mn, Fe, Co or Ni, of which ferrosilicon or manganese-silicon are cheap examples Silicon carbide, which is significantly less reactive but behaves more slowly in a similar way to silicon, is also possible. This silicon stage may be heated to a temperature above 200° C. and preferably between 350° C. and 550° C.

In an alternative embodiment copper or a copper rich material may be added to the first stage to promote the scrubbing of $NF_3$ gas from Nitrogen rich exhaust streams. The copper promotes the formation of $N_2F_4$ which will react more readily in the second stage.

In the second stage, the calcium oxide may be in the form of lime. This can be CaO or CaO mixed with "inert" materials such as graphite (or coke), limestone ($CaCo_3$) or magnesia ($MgCO_3$). It could also be slaked lime ($Ca(OH)_2$), which would give a more fuming product with $SiCl_4$ but would be fine for hydrides (i.e. Silane Diborane Phosphone or Arsine), or even $CaCo_3$, kept at a slightly higher temperature so that it is beginning to decompose to CaO, or dolomite $CaCO_3MgCo_3$. The temperature of this stage may be above 100° C. and preferably between 250° C. and 550° C.

Further purification may be provided in a third stage using copper oxide (CuO or $Cu_2O$) as the active ingredient, and this may be supported on calcium silicate or (calcium oxide plus calcium silicate).

The invention also resides in a method of treating exhaust gases from semi-conductor manufacturing operations, in which the gases are exposed first to silicon or a silicon rich alloy or substance, and then exposed to calcium oxide or a calcium oxide containing compound or material or a soda lime containing medium whereby free halogen or halogen containing compounds in the exhaust gases are first converted into silicon tetra halide compounds which are then converted into involatile calcium silicates and calcium halide compounds leaving the gases substantially free of chlorine or other halogen containing gases.

The invention may be performed in various ways and one specific embodiment with a number of modifications will now be described by way of examples with reference to the accompanying drawings, in which.

Figure 1:
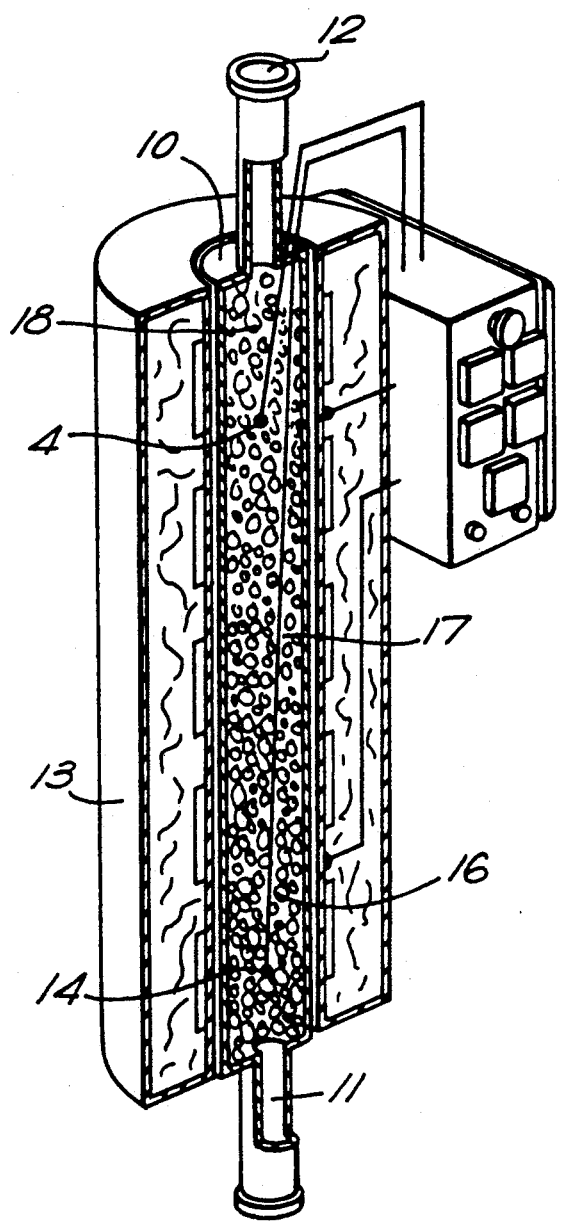
FIG. 1 is a diagrammatic sectional view through one form of exhaust gas conditioning unit or reactor column according to the invention.
Figure 2:
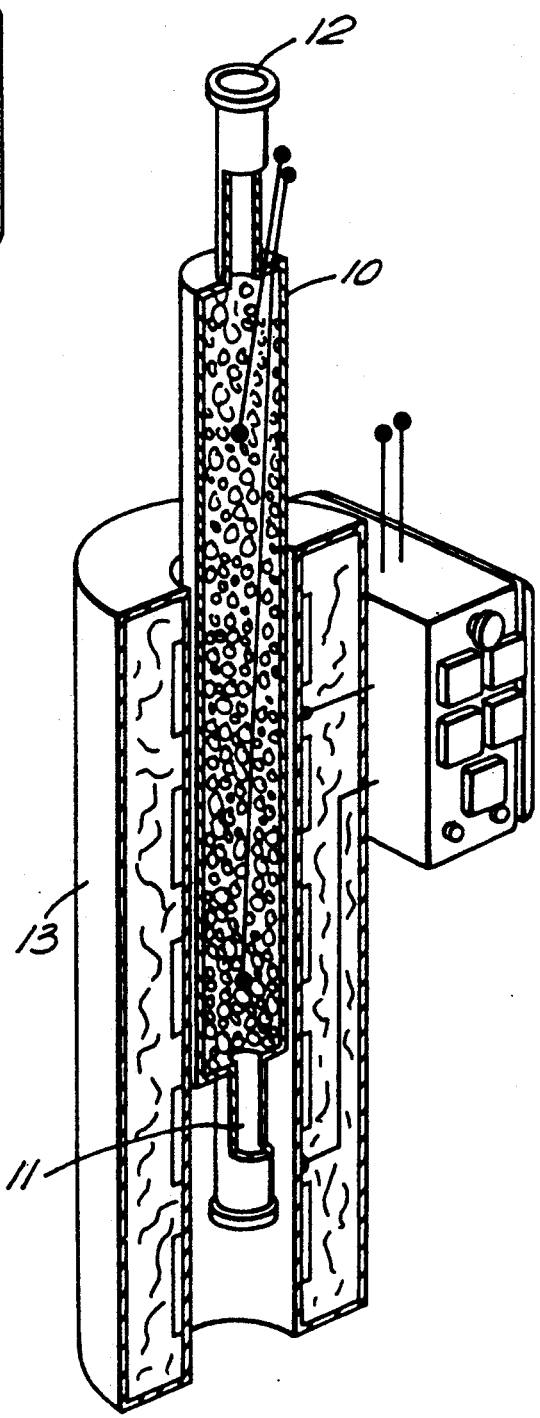
FIG. 2 illustrates the withdrawal of the cartridge unit of the reactor column of FIG. 1.

In the illustrated example of FIG. 1 the unit comprises a common vertical cylinder or column 10, which is in the form of a removable cartridge, having an exhaust gas inlet 11 at the lower end and an outlet 12 at the top. The column is surrounded by an electrically heated furnace 13 and there may be a spaced control thermocouples 14 at different levels. The column is divided into three sections within the same common cylinder. The bottom section 16 contains silicon, the centre section 17 contains lime, and the top section 18 contains copper oxide.

The First Stage (Silicon)

The effluent gases first pass through a bed of granular silicon at an elevated temperature. The silicon quantitatively converts chlorine into silicon tetra chloride and the halogen in carbon/halogen compounds into the corresponding silicon tetra-halide. The hot silicon also causes complete or partial breakdown of another of the effluent gases including silane, diborane, borane, phosphine, arsine and ammonia into hydrogen (which passes through the silicon section) and other elements which will be wholly or partially retained by the silicon.

The silicon used is most economically a metallurgical grade of crystalline or poly-crystalline material with a purity of approximately 98.5%. Higher purity silicon can be used effectively. It is also possible to use silicon-iron alloys known as "ferrosilicon" in place of or mixed with silicon: this increases the ability of the system to retain boron, phosphorous or arsenic, but gas transport of slightly volatile iron halides from the silicon section can cause blocking of gas pipes.

The silicon used should be in the form of granules or lumps, graded in size depending on the expected gas flow through the system. Lumps passing a 100 mm mesh sieve and retained by a 20 mm mesh sieve are ideal for giving very low impedance with high gas velocities, whereas granules, say passing a 15 mm mesh siev and retained by a 3 mm mesh sieve also work, but with a higher flow impedance. Powdered silicon is undesirable as it may catch fire in an oxygen rich effluent stream.

The silicon should be heated in the temperature range 200°-700° C. with the preferred temperature 350°-550° C. The silicon can be contained in any suitable container, e.g. stainless steel, mild steel, graphite, ceramic or quartz, and heat supplied through the walls as shown in the drawings, or alternatively by induction heating or by an internally placed heat source.

The Second Stage (Lime/Soda Lime)

The hot gases/vapours emerging from the silicon stage then pass through a bed of hot granulated lime. This converts silicon tetrahalides into a calcium silicate and a calcium dihalide in an exothermic reaction. It also converts boron trihalides into calcium borate and calcium dihalides and decomposes tetraethylorthosilicate vapour into calcium silicate and diethyl ether, and residual silane or borane are converted into a mixture of hydrogen and calcium silicante and silicon or calcium borate and boron.

The lime needs to be soft permeable structure strong enough to support the weight of the column without crushing to powder. The lime must be kept free of water vapour during storage and may be of a similar size to that described in the silicon section above.

The lime section needs to be maintained at an elevated temperature. A temperature in the region of 100°-600° C. would be suitable with a preferred range of 250°-550° C.

In order to promote the maximum utilization of the lime lumps it is desirable occasionally to cycle the lime temperature widely in order to promote cracking of the surface and the subsequent exposure of the underlying layers. A temperature fluctuation from 100° C. to 400° C. is suitable to promote this thermal cracking.

(Optional) The Third Stage (Copper oxide silica and lime)

This stage will be required for some PECVD applications or for applications having similar exhaust gas emissions. The gases and vapours emerging from the second stage will enter the third stage. The effluent gases/vapours present are residual phosphine arsine, elemental phosphorous and arsenic. These substances react with the copper oxide rich reagent present to form copper phosphate or arsenate and water vapour. In addition carbon monoxide is converted to carbon dioxide and hydrogen will reduce the copper oxide to copper and water.

The reagent (a mixture of copper oxide silica and lime) must first be prepared in a suitable form to be loaded into the reaction vessel. The requirement is to provide a pellet that is porous, of a size to allow the free passage of gas, and strong enough to maintain its integrity within the column. The copper oxide rich section is maintained at an elevated temperature within the range 150°-600° C. with an optimum temperature range of 200°-400° C.

The emission gases are normally well diluted with an inert gas like nitrogen. This nitrogen gas is introduced in the final stages of the pumping stack to "ballast" the pump. In addition it is normal to use dilute reagent gas sources. Hence the concentrations of hydrogen in nitrogen will be well below 10%. This gas concentration known as forming gas is non flammable, and hence presents no fire hazard.

Figure 3:
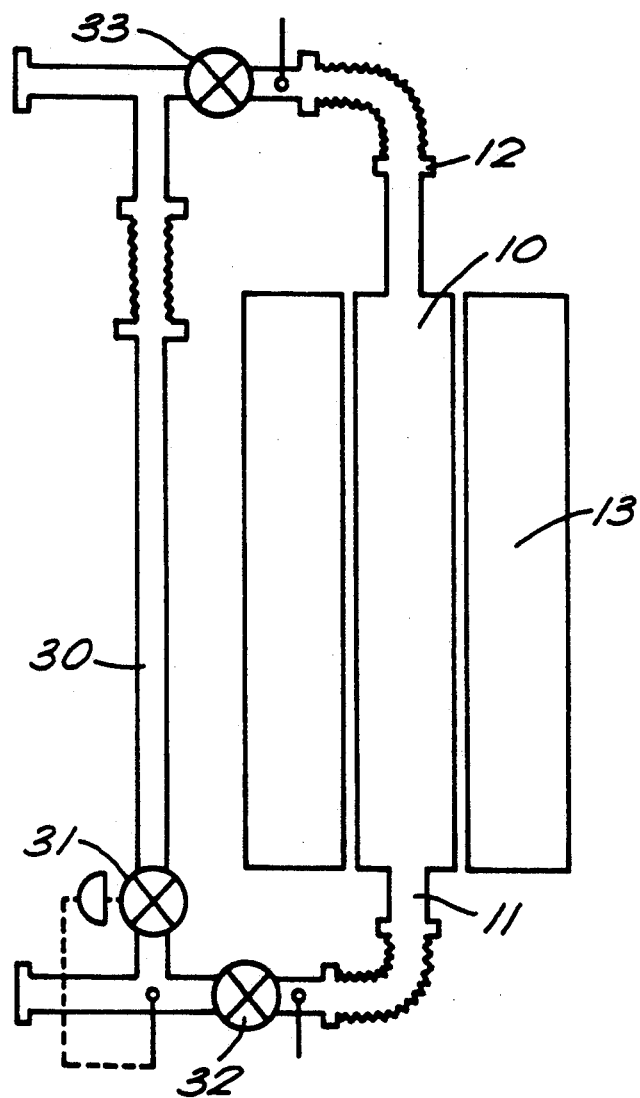
FIG. 3 is a diagrammatic illustration of a piping system including the reactor column of FIG. 1.

FIG. 3 illustrates a possible piping system allowing by-passing of the column 10 during cartridge replacement. This is achieved by by-pass pipe 30, by-pass valve 31 and column isolation valves 32, 33. Valve 31 may operate automatically in the event of a significant pressure build up purge and sampling ports 34, 35 are provided.

Figure 4:
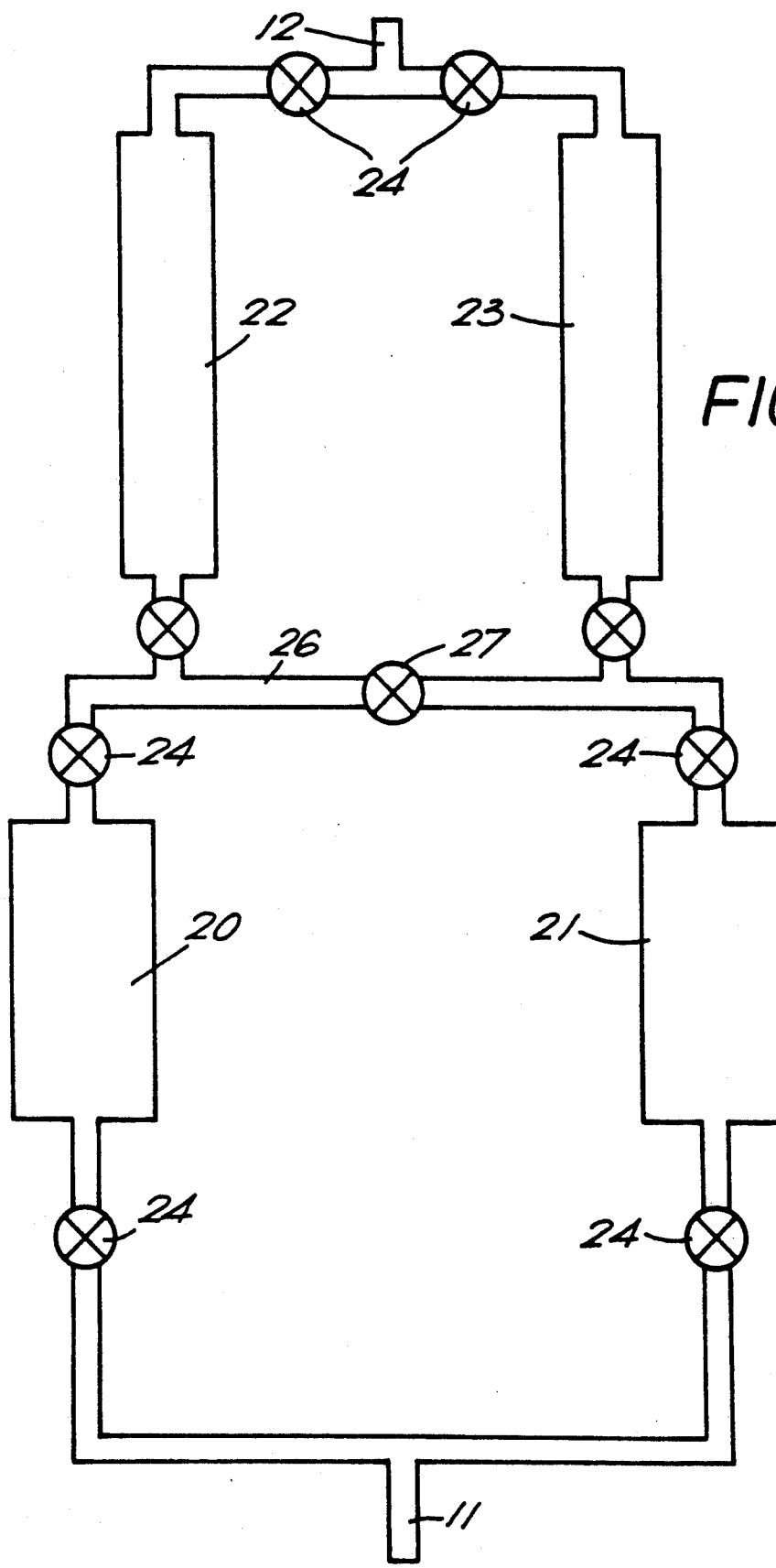
FIG. 4 is a diagrammatic illustration of a dual conditioning system.

FIG. 4 illustrates a dual system in which there are two separate silicon stages 20, 21 positioned in parallel and two separate lime stages 22, 23 also in parallel. Valves 24 are provided to control the flow in and out of the different stages and there is also a cross-communicating passage 26 controlled by valves 27 which allow gases from one side of the system to be transferred to the other side. This may be useful in a system in which the silicon and calcium oxide stages are separate, allowing for a continuous flow to be maintained.

As will be known soda lime is normally calcium hydroxide with sodium hydroxide. Reference in this specification to soda lime should also include a mixture of calcium hydroxide and potassium hydroxide.

We claim:

1. A gas treatment method for use in connection with processes of etching semiconductor devices or of plasma enhanced chemical vapor deposition onto semiconductor materials, the gas treatment method comprising exposing exhaust gases of the processes to first and second active chemical components while heating the first and second active chemical components, wherein the exhaust gases contain at least one component selected from a group consisting of chlorine, silicon tetrachloride, copper chloride, aluminum chloride, silicon tetrafluoride, trifluoromethane, carbonyl fluoride, carbonyl chloride, boron trichloride, boron tribromide, hydrogen chloride, carbon tetrachloride, chloro-fluoro carbon gases, silane, dichlorosilane, tetraethylorthosilicate, diborane, trimethyl borate, phosphine, trimethyl phosphite, and arsine, wherein the first active chemical component is silicon or a silicon-rich alloy or a silicon rich substance and wherein the second active chemical component is calcium oxide, a calcium oxide containing material, or a soda lime containing medium.

2. The gas treatment method of claim 1 in which the first and second active chemical components are in a mixture with one another and the exhaust gases are simultaneously exposed to the first and second active chemical components.

3. The gas treatment method of claim 1 in which the exhaust gases are first exposed to the first active chemical component and then exposed to the second active chemical component.

4. The gas treatment method of claim 1 in which the second active chemical component is heated to a temperature in a range of between 250° C. and 550° C.

5. The gas treatment method of claim 1 in which the first active chemical component is heated to a temperature of at least about 200° C.

6. The gas treatment method of claim 1 in which the first active chemical component is heated to a temperature in a range of between 350° C. and 550° C.

7. The gas treatment method of claim 1 in which after the exhaust gases are exposed to the first and second active chemical components, the exhaust gases are subsequently exposed to copper oxide or a copper oxide rich reagent.

8. The gas treatment method of claim 1 in which the exhaust gases are sequentially exposed to the first active chemical component, the second active chemical component, and are then further exposed to copper oxide or a copper oxide rich reagent.

9. The gas treatment method of claim 1 in which:
the group further consists of nitrogen trifluoride;
the first active chemical component also includes copper or a copper rich material added to the silicon, or the silicon rich alloy, or the silicon rich substance; and
the exhaust gases are first exposed to the first active chemical component and then exposed to the second active chemical component.

10. An apparatus suitable for use in treating exhaust gases produced from etching semiconductor devices and plasma enhanced chemical vapor deposition onto semiconductor materials, said apparatus comprising, means for exposing the exhaust gases to first and second active chemical components, wherein the first active chemical component is silicon or a silicon rich alloy or a silicon rich substance, said first active chemical component additionally containing cooper or a copper rich material, and wherein the second active chemical component is calcium oxide, a calcium oxide containing material, or a soda lime containing medium, and means for heating the first and second active chemical components.

11. The apparatus of claim 10 wherein the first and second active chemical components are in a mixture so that exhaust gases are simultaneously exposed to the first and second active chemical components.

12. The apparatus of claim 10, in which the exposing means has first and second sequential stages in communication with one another and through which the exhaust gases pass during treatment, the first sequential stage containing the first active chemical component, and the second sequential stage containing the second active chemical component.

13. The apparatus of claim 12, in which the calcium oxide is in the form of lime.

14. The apparatus of claim of claim 12, in which the exposing means comprises a single gas treatment chamber subdivided by the first and second active chemical components in two zones of the single gas treatment chamber.

15. The apparatus of claim 12 in which the exposing means further has a third sequential stage comprising copper oxide or a copper oxide rich reagent.

16. The apparatus of claim 15 in which the copper oxide rich reagent is a mixture of copper oxide and lime.

17. The apparatus of claim 12 in which the exposing means includes a replaceable cartridge and the heating means includes an electrically heated furnace having means for receiving the replaceable cartridge and cartridge heating means for heating the at least one replaceable cartridge when received within the receiving means, the replaceable cartridge having, an exhaust gas inlet, an exhaust gas outlet, and at least two sections containing the first and second sequential stages, in communication with one another and communicating between the exhaust gas inlet and outlet.

18. The apparatus of claim 17 in which the replaceable cartridge has spaced control thermocouples at different levels within the chemical components.

19. The apparatus of claim 17 in which the exposing means further has piping means for isolating and bypassing the replaceable cartridge during replacement thereof.

* * * * *

UNITED STATES PATENT AND TRADEMARK OFFICE
CERTIFICATE OF CORRECTION

PATENT NO.   : 5,213,767
DATED        : May 25, 1993
INVENTOR(S)  : Smith et al

It is certified that error appears in the above-indentified patent and that said Letters Patent is hereby corrected as shown below:

Column 6, line 12, delete "cooper" and substitute "copper" therefor.

Signed and Sealed this

Eighth Day of February, 1994

Attest:

BRUCE LEHMAN

Attesting Officer

Commissioner of Patents and Trademarks